(12) United States Patent
Yu et al.

(10) Patent No.: US 6,204,133 B1
(45) Date of Patent: Mar. 20, 2001

(54) SELF-ALIGNED EXTENSION JUNCTION FOR REDUCED GATE CHANNEL

(75) Inventors: Allen S. Yu, Fremont; Paul J. Steffan, Elk Grove, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/586,516

(22) Filed: Jun. 2, 2000

(51) Int. Cl.⁷ .................................................. H01L 21/336
(52) U.S. Cl. .................... 438/299; 438/182; 438/300; 438/303; 438/542; 438/589; 438/595
(58) Field of Search .................................. 438/182, 259, 438/286, 299, 300, 301, 303, 542, 589, 592, 595, 652, 655, 656

(56) References Cited

U.S. PATENT DOCUMENTS

| | | | |
|---|---|---|---|
| 5,545,579 | * 8/1996 | Liang et al. ...................... | 438/291 |
| 5,766,998 | * 6/1998 | Tseng ............................... | 438/291 |
| 6,087,208 | * 7/2000 | Krivokapic et al. ............... | 438/183 |
| 6,090,691 | * 7/2000 | Ang et al. ......................... | 438/564 |

* cited by examiner

Primary Examiner—Charles Bowers
Assistant Examiner—Jack Chen
(74) Attorney, Agent, or Firm—H. Donald Nelson (57) ABSTRACT

A method of manufacturing a semiconductor device having self-aligned extension junctions and a reduced gate channel length by etching an opening in a layer of phosphoro silicate glass that has been deposited on a substrate. The layer of phosphoro silicate glass serves as a self-aligned solid diffusion source to form LDD extensions. Spacers are formed on the walls of the opening in the phosphoro silicate glass and serve to reduce the length of the gate channel. A gate structure is formed by depositing a layer of gate oxide in the opening in the layer of phosphoro silicate glass and a layer of polysilicon is formed over the layer of gate oxide.

10 Claims, 9 Drawing Sheets

SELF-ALIGNED EXTENSION JUNCTION FOR REDUCED GATE CHANNEL

BACKGROUND OF THE INVENTION

1. Field of the Invention

This invention relates generally to the manufacture of high performance semiconductor integrated circuit devices. More specifically, this invention relates to the manufacture of high performance semiconductor transistors having reduced channel lengths. Even more specifically, this invention relates to the manufacture of high performance semiconductor transistors having reduced channel lengths and self-aligned lightly doped drain (LDD) extensions.

2. Discussion of the Related Art

Several performance enhancers for modern semiconductor devices are critical as high performance transistors are scaled to further enhance performance. For example, as the channel length of the transistor is reduced, features such as the lightly doped-drain (LDD) extension regions have been added to solve some of the problems associated with short-channel effects that have resulted from the shortened channel length.

A major obstacle to the formation of very short channel devices is the limitation of commercially available sources of illumination for use in manufacturing processes. The non-availability of illumination devices that would allow the printing of very small features on a layer of photoresist that are then transferred to a further layer, such as a layer of polysilicon. For a "classic" gate structure, the photoresist pattern is first reduced by a well-known resist trimming technique. However, this reduction also reduces the amount of polysilicon, thus increasing the resistance of the device. To then remedy this problem, thicker layers of polysilicon are deposited. However, thicker polysilicon increases the aspect ratio between two adjacent features that results in a non-uniform etch. Another problem of the classic gate manufacturing method is that the upper surface "landing pad" is too small for the next layer, such as an interconnect layer, to properly align upon. The remedy the small upper landing surface, "T" or "notched" gates have been attempted. However, these irregular shaped features require angular or lateral implants to form LDD under the notches. These angular or lateral implants produce poor implant profiles and the resultant overlapping capacitances are not optimal.

Therefore, what is needed is a method to utilize currently commercially available illumination sources, materials, and equipment in such a way that well understood processes can continue to be used to manufacture high performance semiconductor devices.

SUMMARY OF THE INVENTION

According to the present invention, the foregoing and other objects and advantages are attained by a method of manufacturing a semiconductor device having a self-aligned extension junctions and a reduced gate channel length.

In accordance with an aspect of the invention, a layer of phosphoro silicate glass is formed on a substrate. A layer of photoresist is formed on the layer of phosphoro silicate glass, patterned and developed to expose a portion of the phosphoro silicate glass. The phosphoro silicate glass is etched to form an opening to the underlying substrate. Spacers are formed on the walls of the opening. A thermal process forms the LDD extensions by diffusing ions from the phosphoro silicate glass, which serves as a self-aligned solid diffusions source. A gate structure is formed and S/D junctions are formed.

In another aspect of the invention, the gate structure is formed by forming a photoresist gate mask on a blanket layer of polysilicon and etching the polysilicon and underlying layer of phosphoro silicate glass.

In another aspect of the invention, the gate structure is formed by a blanket anisotropic etch to remove the excess portions of the layer of polysilicon.

In another aspect of the invention, the gate structure is formed by chemically mechanically polishing the excess portions of the layer of polysilicon.

The method of the present invention thus effectively provides a semiconductor manufacturing process that uses a patterned layer of phosphoro silicate glass as a self-aligning solid diffusion source to form LDD extensions and a reduced gate channel length.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 1A–1O illustrate a first method of manufacturing a semiconductor device in accordance with the present invention, wherein:

FIGS. 2A–2E illustrate a second embodiment of the present invention, wherein:

FIGS. 3A–3E illustrate a third embodiment of the present invention, wherein:

DETAILED DESCRIPTION

Reference is now made in detail to specific embodiments of the present invention that illustrate the best mode presently contemplated by the inventors for practicing the invention. It is to be understood that although the following description describes a technique to form an NMOS device, a PMOS device can also be formed using borosilicate glass (BSG) rather than phosphoro silicate glass and P+ type ions rather than N+ type ions to form the S/D junctions.

Figure 1A:
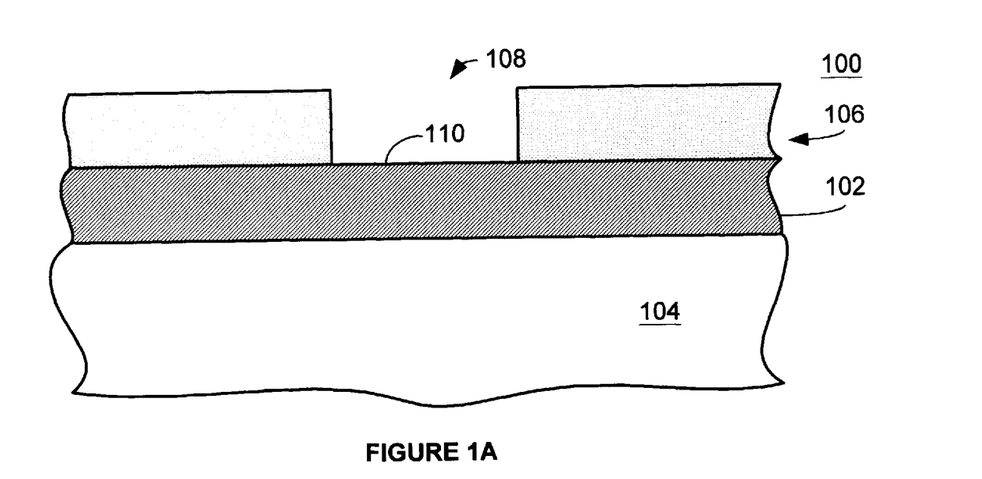
FIG. 1A shows a portion of a structure including a substrate, a layer of phosphoro silicate glass and a layer of photoresist formed on the layer of phosphoro silicate glass and patterned to expose regions of the phosphoro silicate glass.
Figure 1B:
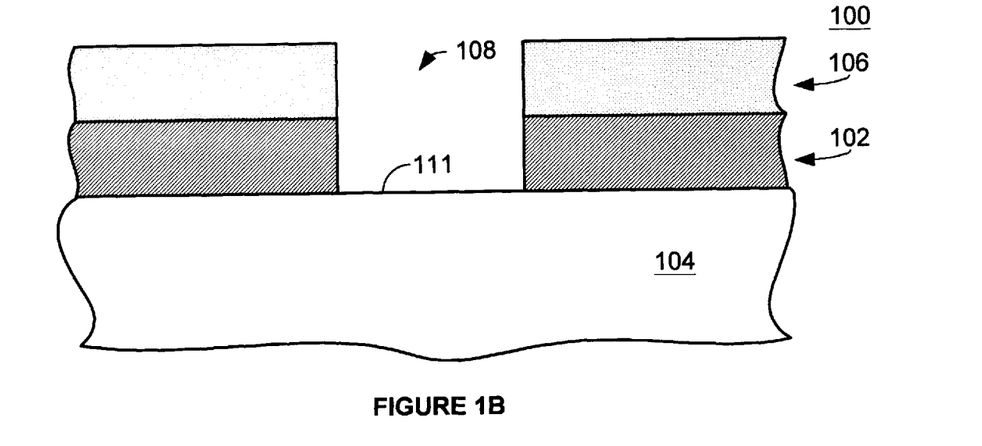
FIG. 1B shows the portion of the structure as shown in FIG. 1A with the exposed regions of phosphoro silicate glass removed down to the substrate forming openings in the phosphoro silicate glass.
Figure 1C:
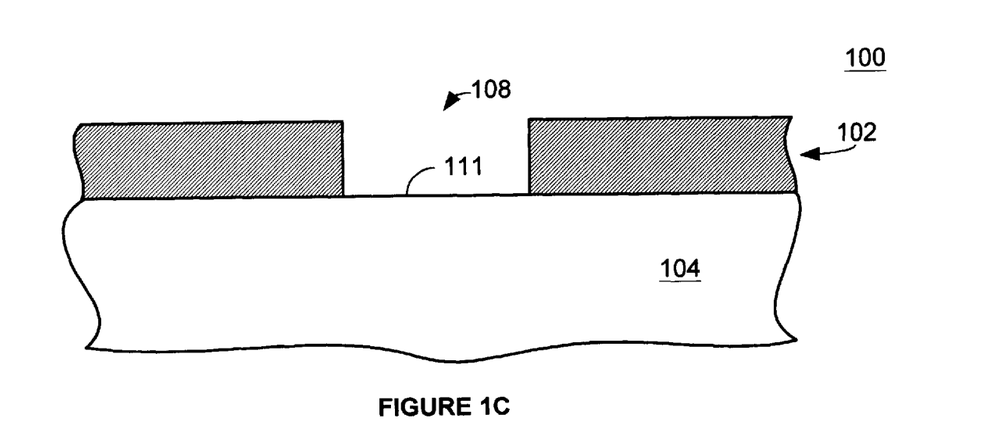
FIG. 1C shows the portion of the structure as shown in FIG. 1B with the remaining layer of photoresist removed.
Figure 1D:
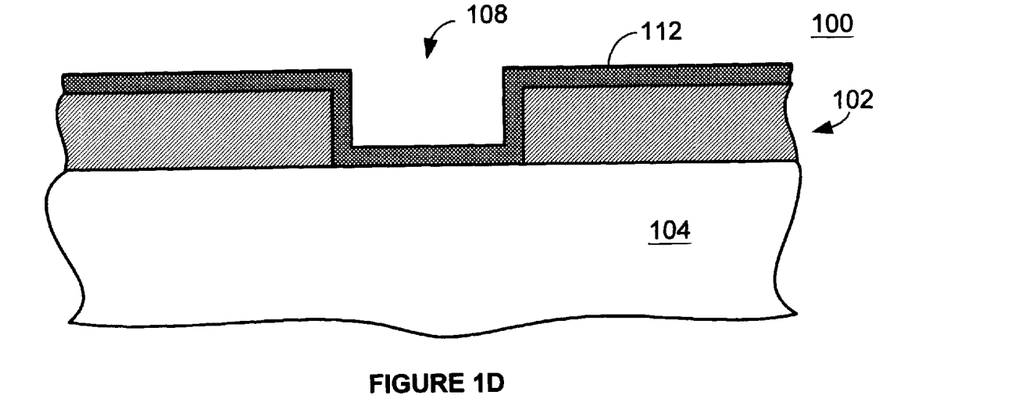
FIG. 1D shows the portion of the structure as shown in FIG. 1C with a conformal layer of dielectric formed on the structure.
Figure 1E:
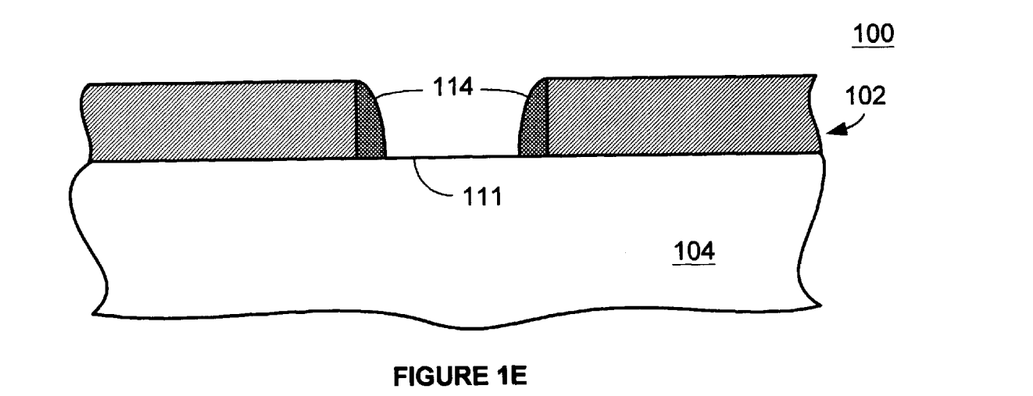
FIG. 1E shows the portion of the structure as shown in FIG. 1D with spacers formed on the walls of the openings formed in the layer of phosphoro silicate glass.
Figure 1F:
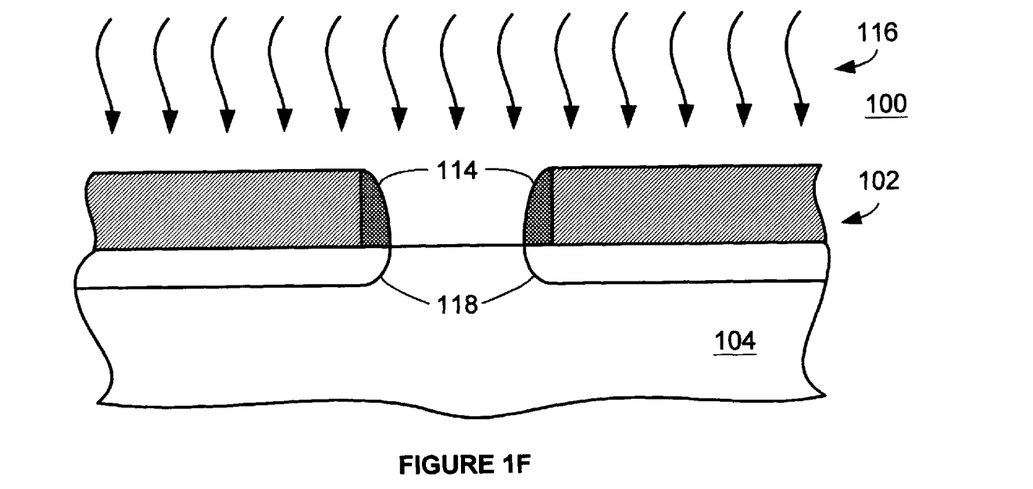
FIG 1F shows the portion of the structure as shown in FIG. 1E undergoing a rapid thermal anneal procedure (RTA) forming LDD extensions from the phosphorous ions in the phosphoro silicate glass.
Figure 1G:
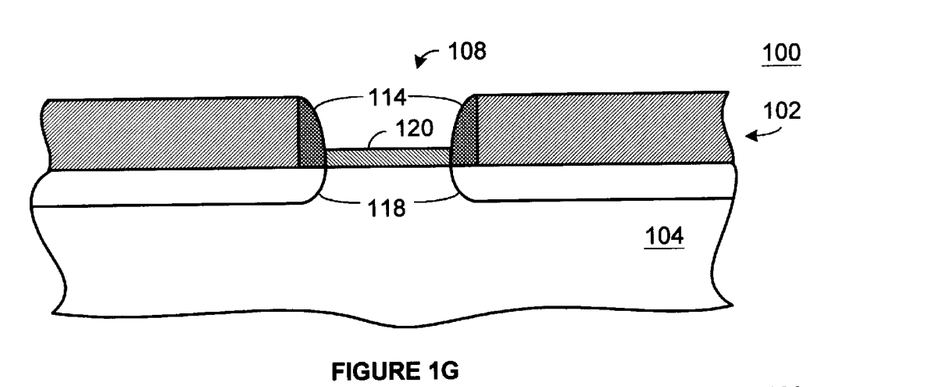
FIG. 1G shows the portion of the structure as shown in FIG. 1F with a layer of high-grade quality gate oxide formed on bottom of the openings in the phosphoro silicate glass.
Figure 1H:
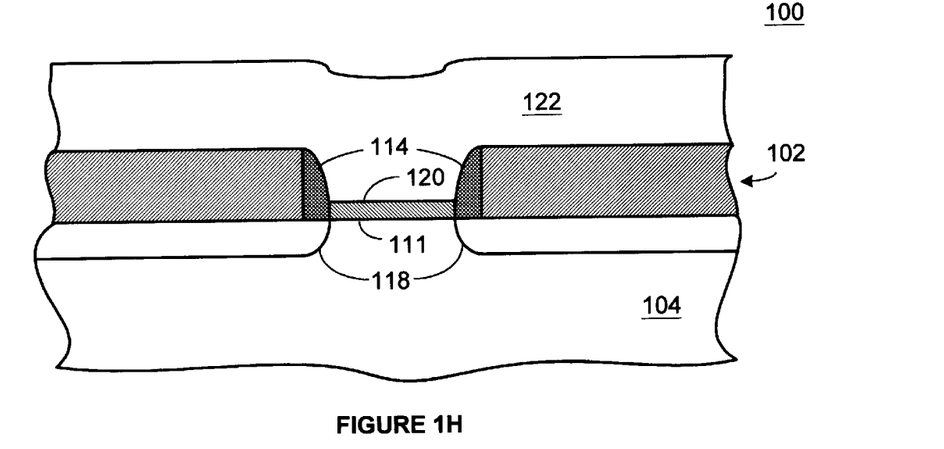
FIG. 1H shows the portion of the structure as shown in FIG. 1G after a blanket layer of polysilicon has been formed on the structure.
Figure 1I:
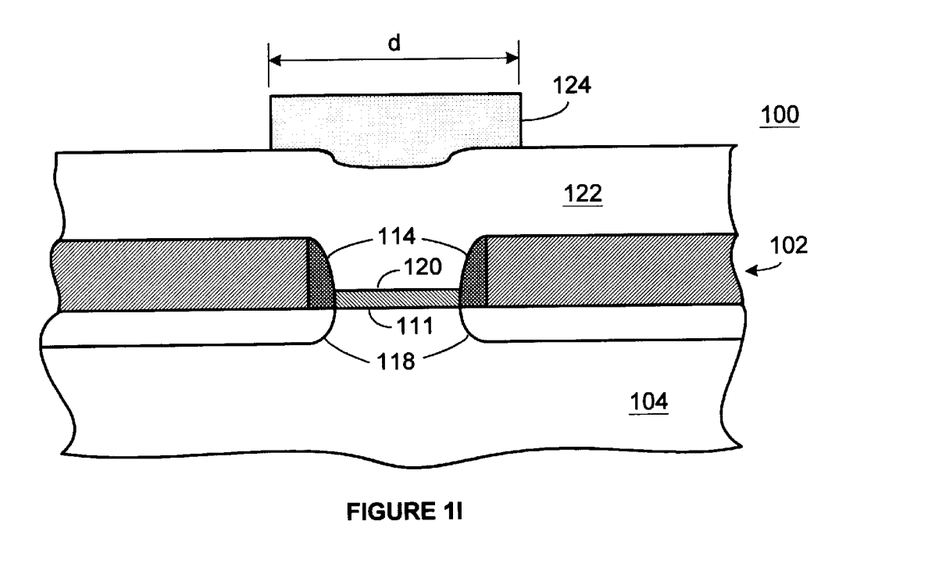
FIG. 1I shows the portion of the structure as shown in FIG. 1H with a photoresist gate mask formed on the layer of polysilicon, patterned and developed exposing regions of the layer of polysilicon.
Figure 1J:
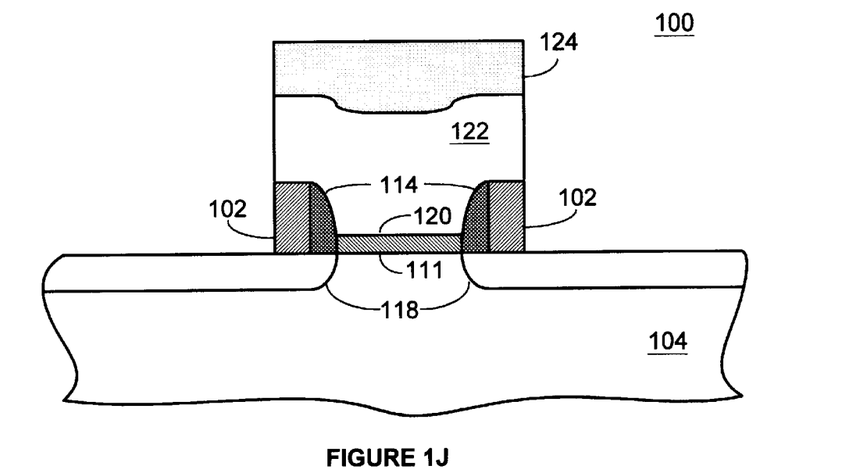
FIG. 1J shows the portion of the structure as shown in FIG. 1I with the exposed regions of the layer of polysilicon glass removed exposing regions of the layer of phosphoro silicate glass.
Figure 1K:
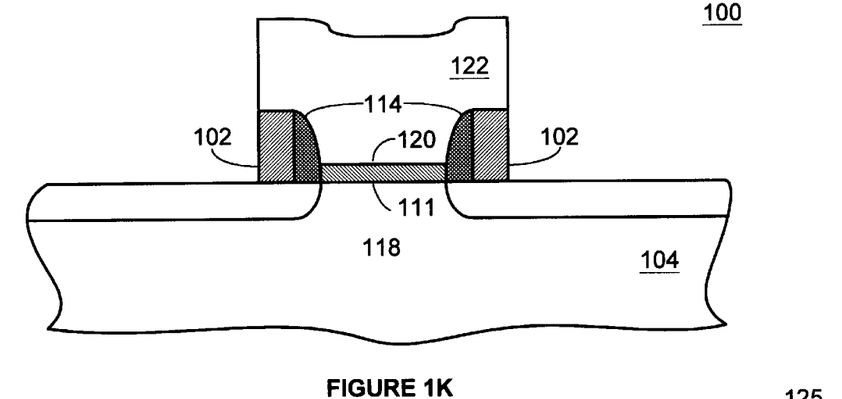
FIG. 1K shows the portion of the structure as shown in FIG. 1J with the photoresist gate mask removed.
Figure 1L:
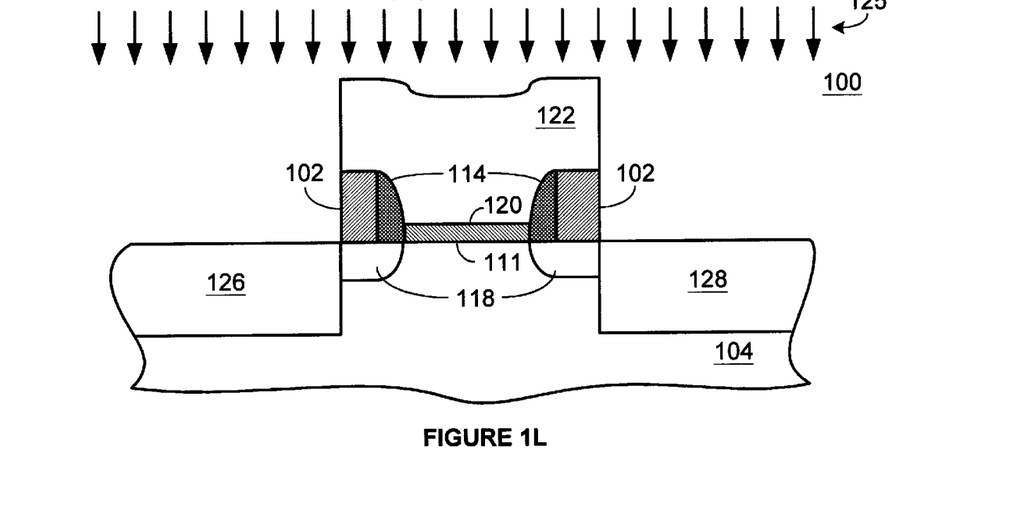
FIG. 1L shows the portion of the structure as shown in FIG. 1K with N+ ions being implanted to form source and drain (S/D) regions.
Figure 1M:
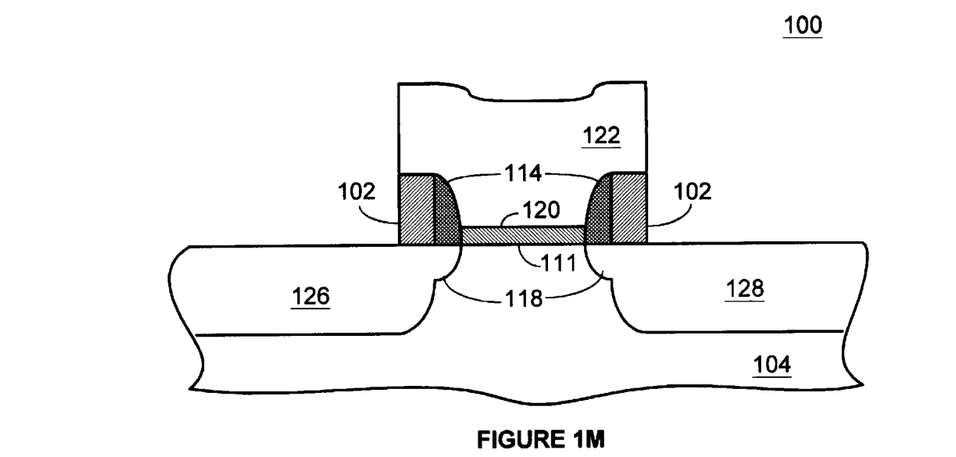
FIG. 1M shows the portion of the structure as shown in FIG. 1L after a rapid thermal anneal process to activate and diffuse the N+ ions to form deep S/D junctions.
Figure 1N:
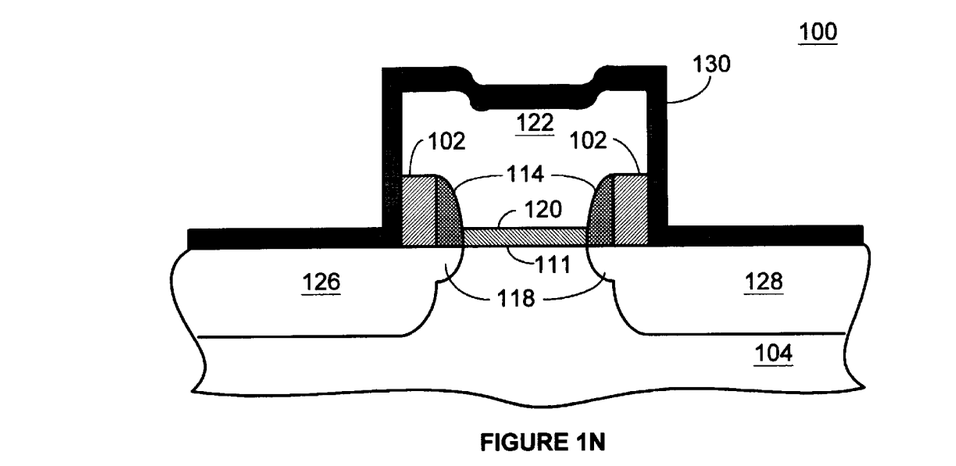
FIG. 1N shows the portion of the structure as shown in FIG. 1M with a conformal layer of metal formed on the structure.
Figure 1O:
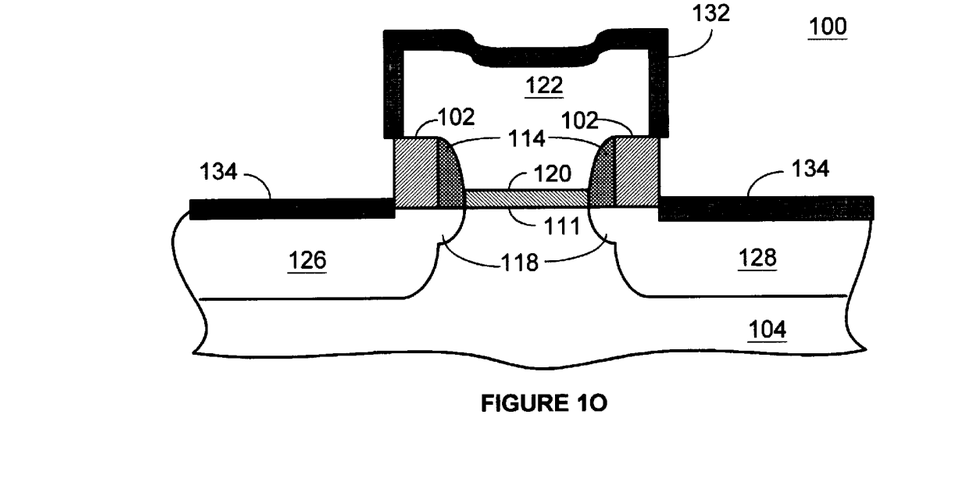
FIG. 1O shows the portion of the structure as shown in FIG. 1N after an RTA process to combine the metal with free silicon to form metallic silicide and after an isotropic to remove the un-reacted metal from the structure.

FIGS. 1A–1O illustrate a first method of manufacturing a semiconductor device in accordance with the present invention. FIG. 1A shows a portion 100 of a semiconductor structure. The portion 100 of the semiconductor structure is a portion of a semiconductor device that is manufactured between isolation structures, which are not shown for the sake of clarity. The portion 100 of the semiconductor structure in FIG. 1A is constructed by depositing a layer 102 of phosphoro silicate glass (PSG) on a substrate 104. The substrate 104 can be bulk silicon or silicon-on-insulator (SOI). A layer 106 of photoresist is formed on the layer 102 of phosphoro silicate glass. The layer 106 of photoresist is patterned and developed to form openings in the layer 106 of photoresist. Methods of patterning and developing photoresist are well known in the art and will not be further discussed. The opening 108 (only one opening is shown and discussed, however it should be understood that many openings can be formed in a typical manufacturing process) in the layer of photoresist 106 exposes a portion 110 of the underlying layer 102 of phosphoro silicate glass. The pattern for the opening 108 is formed having the minimum printable size using the current commercially available lithographic techniques. It should be understood that the minimum printable size can vary depending upon the equipment being used, the optical system being used and the individual piece of equipment being utilized. It should be further understood that the minimum printable size is a value readily determinable for each piece of equipment and that this value is well known by the manufacturer and by the design and process engineers in the manufacturing facility. The minimum printable size is a value that is determined for each piece of equipment by trial and error and is a value that is continuously updated so that the design engineers can accurately design new products and so that the process engineers can continuously attempt to maintain the smallest printable size possible.

FIG. 1B shows the portion 100 of the structure as shown in FIG. 1A after an anisotropic etch is used to etch the exposed portion 110 of the layer 102 of phosphoro silicate glass. The layer of 102 is etched during the anisotropic etching process and the etching process is stopped at the substrate 104 exposing a region 111 of the substrate 104. Anisotropic etching processes are well known in the art and will not be discussed.

FIG. 1C shows the portion 100 of the structure as shown in FIG. 1B after the remaining layer 106 has been stripped from the portion 100 of the structure. The method of stripping the layer 106 of photoresist is well known and will not be discussed.

FIG. 1D shows the portion 100 of the structure as shown in FIG. 1C after a conformal layer 112 of dielectric has been deposited on the patterned layer 102 of phosphoro silicate glass.

FIG. 1E shows the portion 100 of the structure as shown in FIG. 1D after spacers 114 have been formed on the walls of the opening 108 in the layer 102 of phosphoro silicate glass. The spacers 114 are formed by an anisotropic etch process of the conformal layer 112 of dielectric and as should be appreciated the spacers 114 consist of the dielectric used to form the conformal layer 112 of dielectric. The spacers 114 reduce the length of the gate and provide a space to reduce overlapping capacitance by offsetting the diffusion of ions.

FIG. 1F shows the portion 100 of the structure as shown in FIG. 1E undergoing a thermal process, indicated by the wavy arrows 116. The thermal process is utilized to diffuse the phosphorus ions from the phosphoro silicate glass into the substrate 104. The thermal process is controlled so that the phosphorus ions diffuse to the edge of the spacers 114 forming lightly doped drain (LDD)junctions 118. As is known in the semiconductor art, the term LDD is used to describe both the lightly doped source and drain junctions formed in the substrate.

FIG. 1G shows the portion 100 of the structure as shown in FIG. 1F after a layer 120 of high-grade quality gate oxide is formed on portion 111 of the substrate. The layer 120 of high-grade quality gate oxide will be the gate of the transistor subsequently formed in the portion 100 of the structure.

FIG. 1H shows the portion 100 of the structure as shown in FIG. 1G after a blanket layer 122 of polysilicon has been deposited on the portion 100 of the structure. A portion of the layer 122 of polysilicon and the layer 120 of high quality gate oxide forms a gate structure for the transistor that is to be formed.

FIG. 1I shows the portion 100 of the structure as shown in FIG. 1H with a photoresist gate mask 124 formed on the blanket layer 122 of polysilicon, patterned and developed exposing regions of the blanket layer 122 of polysilicon. The dimension "d" of the photoresist gate mask is selected so that the photoresist gate mask 124 serves not only to form the polysilicon gate but also the edges defines the boundaries of the subsequent N+ S/D implant. The dimension "d" of the photoresist gate mask also provides the margin for the contacts, which is larger than the sub-minimum printable gate, so that the contacts land within the polysilicon gate.

FIG. 1J shows the portion 100 of the structure as shown in FIG. 1I after an anisotropic etch process that etches the exposed portions of the layer 122 of polysilicon and the underlying portions of the layer 102 of phosphoro silicate glass exposing portions of the substrate 104.

FIG. 1K shows the portion 100 of the structure as shown in FIG. 1J after the remaining photoresist gate mask have been stripped from the portion 100 of the structure.

FIG. 1L shows the portion 100 of the structure as shown in FIG. 1K undergoing an N+ S/D implant, indicated by arrows 125. Typically, the N+ S/D implant ions are phosphorus or arsenic ions. As implanted, the N+ S/D implant ions occupy spaces 126 & 128 in the substrate 104. It is noted that the spaces 126 & 128 partially overlap spaces previously designated 118.

FIG. 1M shows the portion 100 of the structure as shown in FIG. 1L after a thermal process to diffuse the N+ S/D ions and form deep S/D junctions.

FIG. 1N shows the portion 100 of the structure as shown in FIG. 1M with a conformal layer 130 of a metal such as cobalt, nickel, or platinum is formed over the surface of the portion 100 of the structure.

FIG. 1O shows the portion 100 of the structure as shown in FIG. 1N after a thermal process that combines the metal with free silicon to form metallic silicide. A layer 132 of metallic silicide is formed on the surface of the polysilicon gate, a layer 134 of metallic silicide is formed on the surface of the S/D regions, 126 & 128, respectively. The metallic silicide provides low resistance junctions.

FIGS. 2A–2E illustrate a second method of manufacturing a semiconductor device in accordance with the present invention.

Figure 2A:
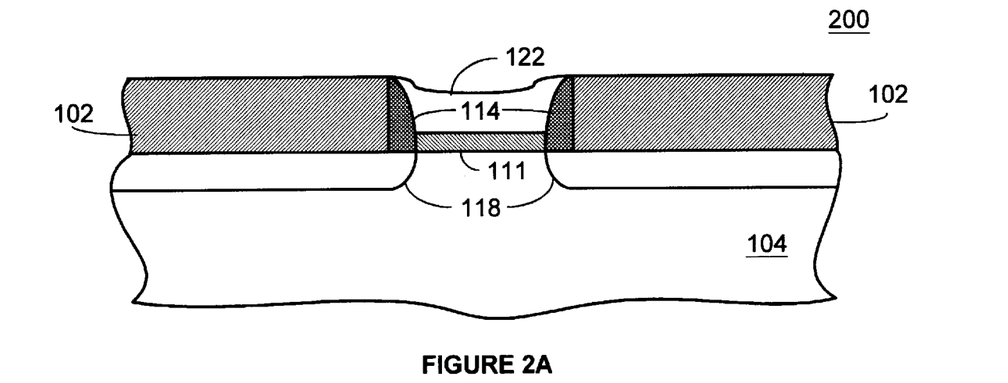
FIG. 2A shows the portion of the structure as shown in FIG. 1H with excess portions of the layer of polysilicon removed.

FIG. 2A shows a portion 200 of the structure as shown in FIG. 1H after a blanket anisotropic etch removes excess polysilicon leaving only a portion 122.

Figure 2B:
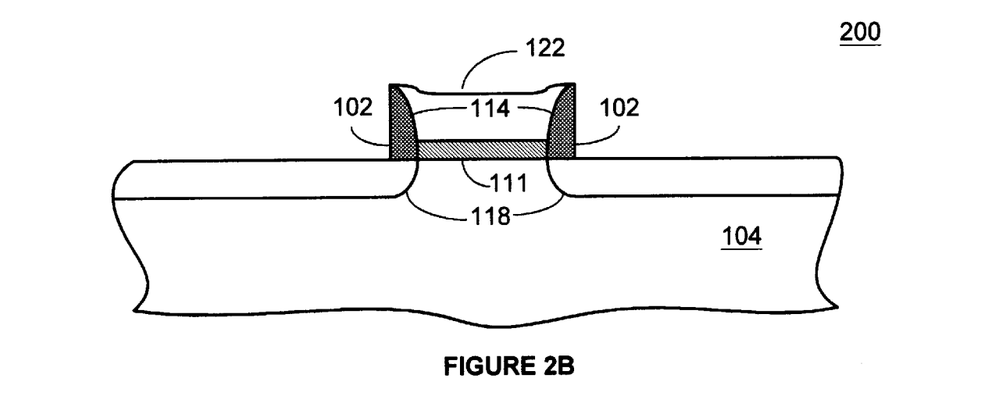
FIG. 2B shows the portion of the structure as shown in FIG. 2A with the remaining portions of the layer of phosphoro silicate glass removed.

FIG. 2B shows the portion 200 of the structure as shown in FIG. 2A after an etch process that removes the remaining portions of the layer 102 of phosphoro silicate glass.

Figure 2C:
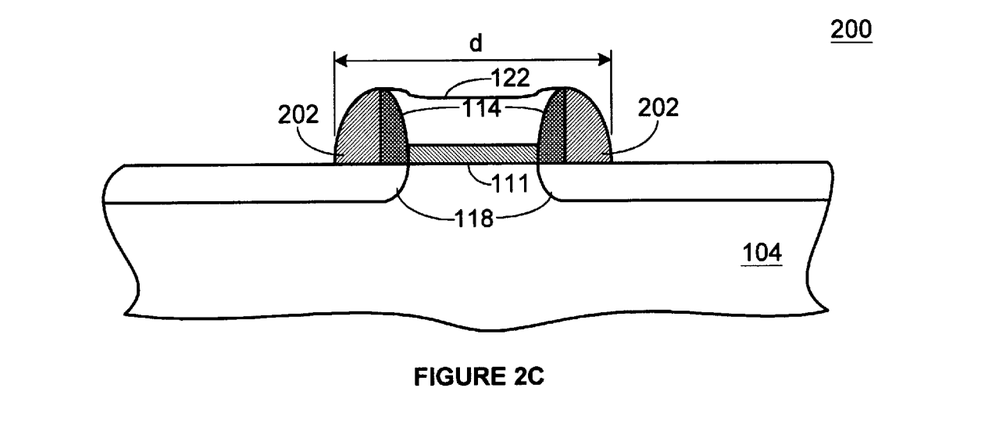
FIG. 2C shows the portion of the structure as shown in FIG. 2B with sidewall spacers formed on the gate structure.

FIG. 2C shows the portion 200 of the structure as shown in FIG. 2B after sidewall spacers 202 & 204 have been formed. The dimension "d" defines the boundaries of the subsequent S/D implant.

Figure 2D:
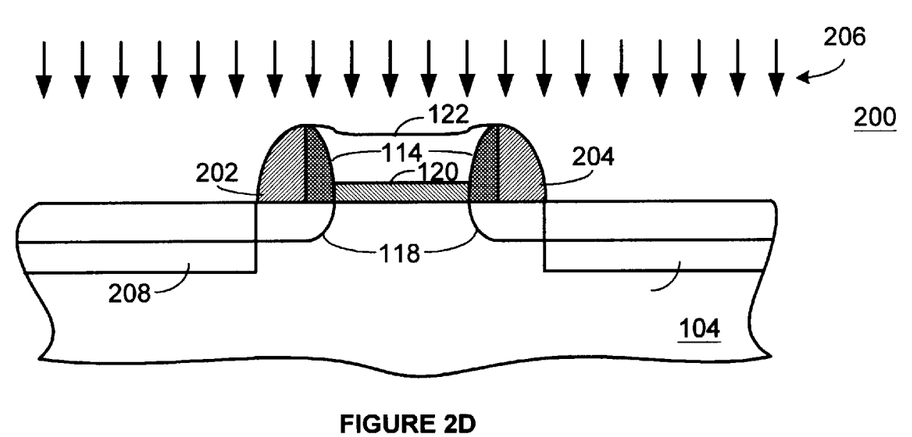
FIG. 2D shows the portion of the structure as shown in FIG. 2C undergoing N+ S/D implantation to form deep S/D junctions.

FIG. 2D shows the portion 200 of the structure as shown in FIG. 2C undergoing an N+ S/D implant, indicated by arrows 206. Typically, the N+ S/D implant ions are phosphorus or arsenic ions. As implanted, the N+ S/D implant ions occupy spaces 208 & 210 in the substrate 104. It is noted that the spaces 208 & 210 partially overlap spaces previously designated 118.

Figure 2E:
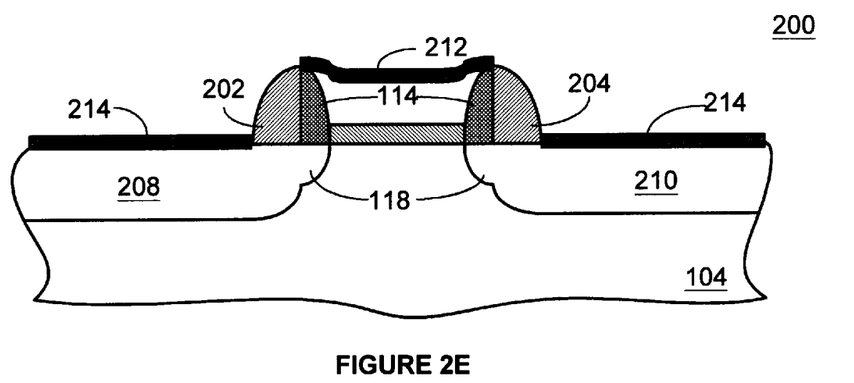
FIG. 2E shows the portion of the structure as shown in FIG. 2D with metallic silicide formed on surfaces of the portion of the structure.

FIG. 2E shows the portion 200 of the structure as shown in FIG. 2D after a thermal process to diffuse the N+ S/D ions and form deep S/D junctions. Also shown is a layer 212 of metallic silicide formed on the surface of the polysilicon gate and metallic silicide layers 214 on the surfaces of the S/D regions 208 & 210.

FIGS. 3A–3E illustrate a third method of manufacturing a semiconductor device in accordance with the present invention.

Figure 3A:
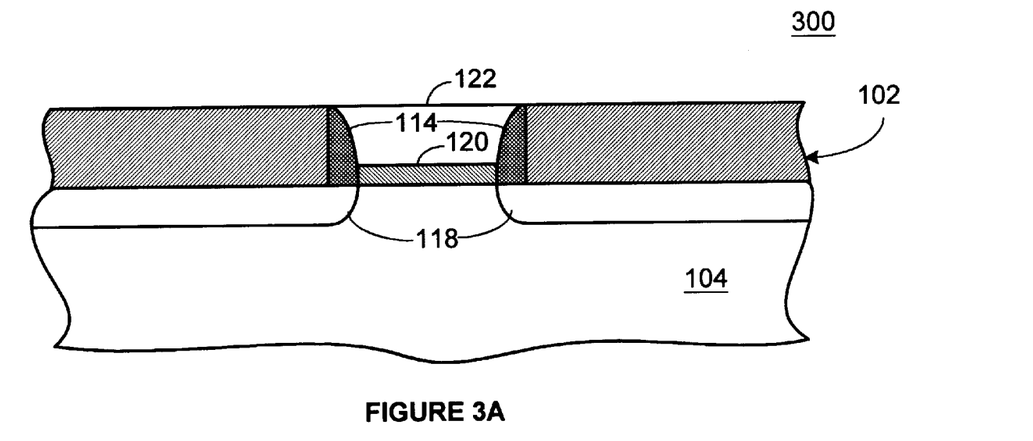
FIG. 3A shows the portion of the structure as shown in FIG. 1H with excess portions of the layer of polysilicon removed.

FIG. 3A shows a portion 300 of the structure as shown in FIG. 1H after a chemical mechanical polish (CMP) removes excess polysilicon leaving only a portion 122.

Figure 3B:
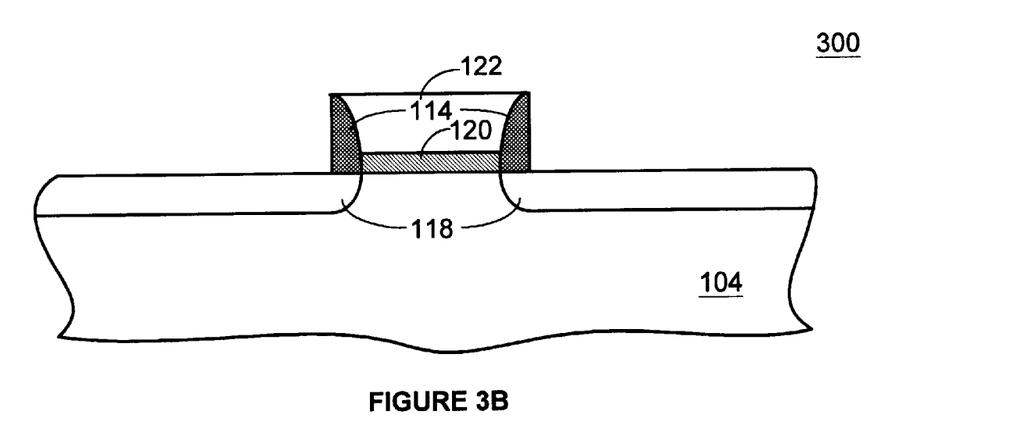
FIG. 3B shows the portion of the structure as shown in FIG. 3A with the remaining portions of the layer of phosphoro silicate glass removed.

FIG. 3B shows the portion 300 of the structure as shown in FIG. 3A after an etch process that removes the remaining portions of the layer 102 of phosphoro silicate glass.

Figure 3C:
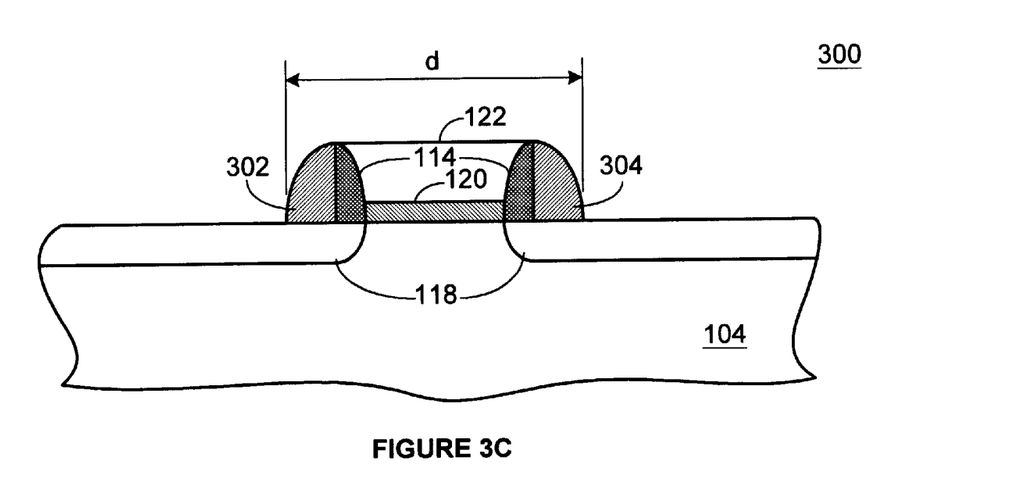
FIG. 3C shows the portion of the structure as shown in FIG. 3B with sidewall spacers formed on the gate structure.

FIG. 3C shows the portion 300 of the structure as shown in FIG. 3B after sidewall spacers 302 & 304 have been formed. The dimension "d" defines the boundaries of the subsequent S/D implant.

Figure 3D:
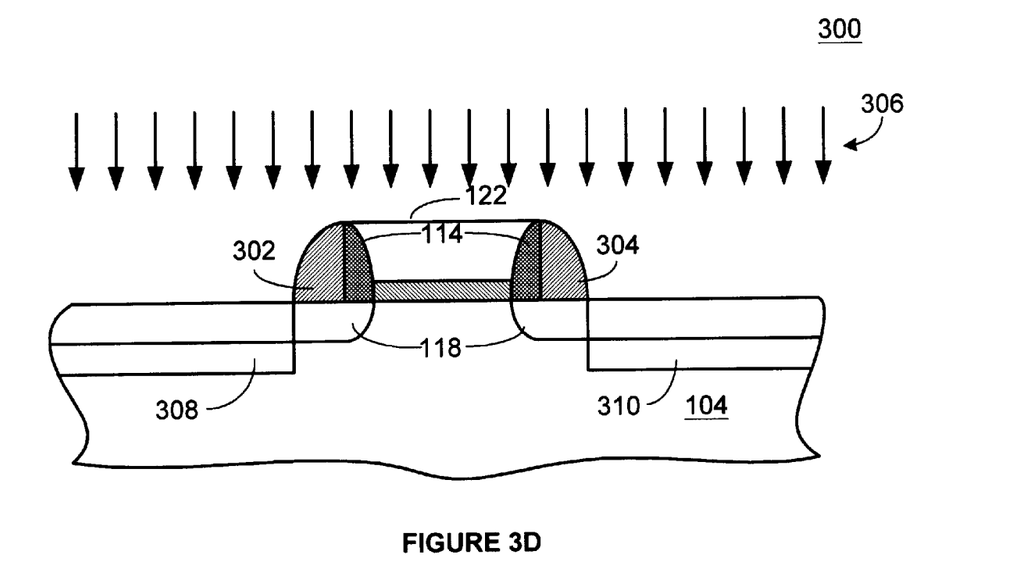
FIG. 3D shows the portion of the structure as shown in FIG. 3C undergoing N+ SID implantation to form deep S/D junctions.

FIG. 3D shows the portion 300 of the structure as shown in FIG. 3C undergoing an N+ SID implant, indicated by arrows 306. Typically, the N+ S/D implant ions are phosphorus or arsenic ions. As implanted, the N+ S/D implant ions occupy spaces 308 & 310 in the substrate 104. It is noted that the spaces 308 & 310 partially overlap spaces previously designated 318.

Figure 3E:
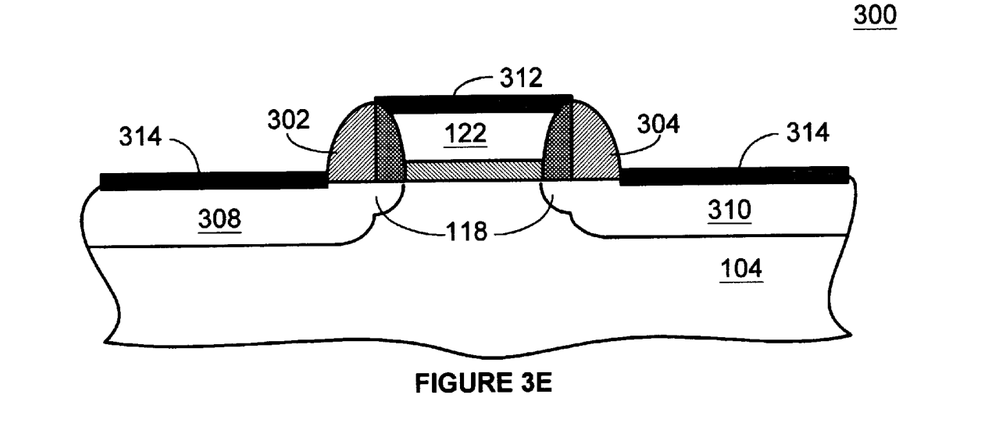
FIG. 3E shows the portion of the structure as shown in FIG. 3D with metallic silicide formed on silicon surfaces.

FIG. 3E shows the portion 300 of the structure as shown in FIG. 3D after a thermal process to diffuse the N+ S/D ions and form deep S/D junctions. Also shown is a layer 312 of metallic silicide formed on the surface of the polysilicon gate and metallic silicide layers 314 on the surfaces of the S/D regions 308 & 310.

In summary, the results and advantages of the method of the present invention can now be more fully realized. The method of manufacturing semiconductor devices provides effectively uses a patterned layer of phosphoro silicate glass as a self-aligned solid diffusion source to form LDD extensions and a reduced gate channel length.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device having self-aligned extension junctions and a reduced gate channel length, the method comprising:

(a) depositing a layer of phosphoro silicate glass on a substrate;

(b) forming a layer of photoresist on the layer of phosphoro silicate glass;

(c) patterning the layer of photoresist with a lithographic system, wherein the photoresist is patterned with a dimension having a minimum printable size available from the lithographic system;

(d) developing the patterned layer of photoresist forming an opening in the layer of photoresist and exposing a portion of the layer of phosphoro silicate glass;

(e) etching the exposed portion of the layer of phosphoro silicate glass forming an opening in the layer of phosphoro silicate glass and exposing a portion of the substrate, wherein remaining portions of the layer of phosphoro silicate glass form self-aligning solid diffusion sources for a formation of LDD extensions;

(f) forming spacers on walls of the opening in the layer of phosphoro silicate glass, wherein the spacers reduce a length of a gate structure to be formed and reduces an overlapping capacitance in the semiconductor device by offsetting the diffusion of ions used to form the LDD extensions;

(g) forming the LDD extensions in the substrate;

(h) forming the gate structure; and (i) forming S/D junctions, wherein the gate structure is formed by:

(j) forming a layer of high quality gate oxide on an exposed surface of the substrate in the opening formed in the layer of phosphoro silicate glass;

(k) depositing a blanket layer of polysilicon;

(l) forming a photoresist gate mask on the blanket layer of polysilicon exposing portions of the blanket layer of the polysilicon;

(m) etching exposed portions of the blanket layer of polysilicon exposing portions of the underlying layer of phosphoro silicate glass; and (n) removing the photoresist gate mask.

2. The method of claim 1 wherein the LDD extensions in the substrate are formed by a thermal process that diffuses phosphorus ions in the phosphoro silicate glass into the substrate, thereby forming the LDD extensions.

3. The method of claim 1 wherein the S/D junctions are formed by:

(o) implanting N+ ions into the substrate; and (p) diffusing the N+ ions to form the S/D junctions.

4. The method of claim 3 further comprising forming a metallic silicide layer on exposed surfaces of the gate structure and exposed surfaces of the substrate.

5. The method of claim 2 wherein the gate structure is formed by:

(j) forming a layer of high quality gate oxide on an exposed surface of the substrate in the opening formed in the layer of phosphoro silicate glass;

(k) depositing a blanket layer of polysilicon;

(l) anisotropically etching a excess portion of the blanket layer of polysilicon;

(m) removing the layer of phosphoro silicate glass exposing the spacers formed in step (f); and (n) forming sidewall spacers on the exposed spacers.

6. The method of claim 5 wherein the S/D junctions are formed by:

(o) implanting N+ ions into the substrate; and (p) diffusing the N+ ions to form the S/D junctions.

7. The method of claim 6 further comprising forming a metallic silicide layer on exposed surfaces of the gate structure and exposed surfaces of the substrate.

8. The method of claim 2 wherein the gate structure is formed by:

(j) forming a layer of high quality gate oxide on an exposed surface of the substrate in the opening formed in the layer of phosphoro silicate glass;

(k) depositing a blanket layer of polysilicon;

(l) removing a excess portion of the blanket layer of polysilicon by a chemical mechanical polish (CMP);

(m) removing the layer of phosphoro silicate glass exposing the spacers formed in step (f); and (n) forming sidewall spacers on the exposed spacers.

9. The method of claim 8 wherein the S/D junctions are formed by:

(o) implanting N+ ions into the substrate; and (p) diffusing the N+ ions to form the S/D junctions.

10. The method of claim 9 further comprising forming a metallic silicide layer on exposed surfaces of the gate structure and exposed surfaces of the substrate.

* * * * *